United States Patent
Minami

(10) Patent No.: US 7,265,419 B2
(45) Date of Patent: Sep. 4, 2007

(54) SEMICONDUCTOR MEMORY DEVICE WITH CELL TRANSISTORS HAVING ELECTRICALLY FLOATING CHANNEL BODIES TO STORE DATA

(75) Inventor: Yoshihiro Minami, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/041,250

(22) Filed: Jan. 25, 2005

(65) Prior Publication Data

US 2006/0113686 A1    Jun. 1, 2006

(30) Foreign Application Priority Data

Nov. 26, 2004    (JP) ............................. 2004-341937

(51) Int. Cl.
*H01L 27/01* (2006.01)
(52) U.S. Cl. .................. 257/347; 257/296; 257/900; 257/E27.112; 257/E21.431
(58) Field of Classification Search ............... 257/296, 257/347, 900, E27.112, E21.431
See application file for complete search history.

(56) References Cited

U.S. PATENT DOCUMENTS

| | | | |
|---|---|---|---|
| 6,333,222 B1 * | 12/2001 | Kitazawa et al. | ........... 438/241 |
| 6,538,916 B2 | 3/2003 | Ohsawa | |
| 6,617,651 B2 | 9/2003 | Ohsawa | |
| 6,621,725 B2 | 9/2003 | Ohsawa | |
| 6,771,546 B2 | 8/2004 | Ikehashi et al. | |
| 6,825,524 B1 * | 11/2004 | Ikehashi et al. | ............. 257/314 |
| 7,023,054 B2 * | 4/2006 | Ohsawa | ....................... 257/369 |
| 7,067,881 B2 * | 6/2006 | Matsumoto et al. | ........ 257/347 |

* cited by examiner

*Primary Examiner*—Andy Huynh
(74) *Attorney, Agent, or Firm*—Oblon, Spivak, McClelland, Maier & Neustadt, P.C.

(57) ABSTRACT

A semiconductor memory device includes: a semiconductor device base having an insulating substrate and a semiconductor layer overlying it; a cell array formed on the semiconductor device base with cell transistors disposed in such a manner that each of source and drain layers is shared by adjacent two cell transistors arranged in a direction, the cell transistor having an electrically floating channel body to store data defined by a carrier accumulation state of the channel body; and logic transistors formed on the semiconductor device base to constitute a peripheral circuit of said cell array, wherein at least a part of source and drain layers of each the cell transistor is formed with a thickness different from source and drain layers of the logic transistors.

5 Claims, 12 Drawing Sheets

SEMICONDUCTOR MEMORY DEVICE WITH CELL TRANSISTORS HAVING ELECTRICALLY FLOATING CHANNEL BODIES TO STORE DATA

CROSS-REFERENCE TO RELATED APPLICATION

This application is based on and claims the benefit of priority from the prior Japanese Patent Application No. 2004-341937, filed on Nov. 26, 2004, the entire contents of which are incorporated herein by reference.

BACKGROUND OF THE INVENTION

1. Field of the Invention

This invention relates to a semiconductor memory device and a method of fabricating the same. More particularly, the invention relates to a memory device with cell transistors formed on a SOI substrate, each cell transistor having an electrically floating channel body to store data defined by a carrier accumulation state of the channel body.

2. Description of Related Art

Recently, for the purpose of alternative use or replacement of conventional DRAMs, a semiconductor memory device that has a more simplified cell structure for enabling achievement of dynamic storability has been provided. A memory cell (i.e., cell transistor) is formed of a single transistor which has an electrically floating body (channel body) as formed on a silicon-on-insulator (SOI) substrate. This cell transistor stores two-value data as follows: a first data (for example, logic "1" data) is stored as a state that an excess number of majority carriers are accumulated or stored in the body; and a second data (for example, logic "0" data) is stored as a state that the excessive majority carriers are drawn out from the body. Such the memory has been described in, for example, Unexamined Japanese Patent Application Publication No. 2003-68877.

The memory cell of the type stated above will be referred to hereinafter as a "floating-body cell (FBC)". A semiconductor memory using FBCs will be referred to as a "FBC memory". The FBC memory makes use of no capacitors unlike currently available standard DRAM chips so that the memory cell is simpler in memory cell array structure and smaller in unit cell area than ever before. Thus, the FBC memory is readily scalable in cell structure and advantageously offers much enhanced on-chip integration capabilities.

For writing logic "1" data in the FBC memory, impact ionization near the drain of a memory cell is utilized. More specifically, with giving an appropriate bias condition for permitting flow of a significant channel current in the memory cell, majority carriers (holes in case of n-channel cell transistor) are generated by impact ionization and stored in the floating body. Writing logic "0" data is performed by setting a PN junction between the drain and the body in a forward bias state, thereby releasing the body's majority carries toward the drain side.

A difference between carrier storage states of the floating body appears as a difference between threshold voltages of the cell transistor. Thus, detect whether an appreciable cell current is present or absent, alternatively, whether the cell current is large or small in magnitude, by applying a read voltage to the gate of the cell transistor, and it is possible to determine or sense whether the resultant read data is a logic "0" or "1". The carrier accumulation state of the body may be retained with applying a certain holding voltage to the gate.

To achieve highly integrated FBC memories, it is desirable to use such an arrangement that adjacent two cell transistors arranged in the direction of the bit line share a source/drain layer without disposing a device isolation area between them. One problem with this, however, is that data reliability is reduced.

The problem will be explained in detail with reference to FIG. 16. FIG. 16 shows two cell transistors MTi and MTi+1 which are disposed as adjacent in the direction of a bit line (BL). Each cell transistor is formed on a p-type silicon layer 3 serving as a channel body. The silicon layer 3 is formed on a silicon substrate 1 with an insulating film 2 interposed therebetween. Gate electrodes 4 of the cell transistors MTi and MTi+1 are formed as elongated in the direction perpendicular to the drawing plain to constitute word lines WLi and WLi+1, respectively.

The two cell transistors MTi and MTi+1 share an n-type diffusion layer (i.e., drain layer) 5, to which the bit line BL is contacted. Other n-type layers (i.e., source layers) of these transistors are shared by these cell transistors and adjacent ones (not shown), to which source lines are contacted.

FIG. 16 shows carrier movement in the channel body in a state where "0" write is performed in one cell transistor MTi within two cell transistors MTi and MTi+1. In this case, with applying a forward bias between the drain diffusion layer 5 connected to the bit line BL and the channel body 3, holes (i.e., majority carriers designated by symbol "+") in the channel body 3 of the cell transistor MTi are drawn to the drain layer 5.

At this time, part of the holes drawn in the drain diffusion layer 5 passes through this layer 5 to be injected into the channel body of the adjacent cell transistor MTi1+1. This is a result of that a parasitic pnp transistor formed between two channel bodies of the cell transistors MTi and MTi+1 becomes on. Therefore, if the cell transistor MTi+1 is storing "0" data, "1" may be erroneously written into it. This erroneous write (i.e., data destruction) will be referred to as "bipolar disturbance" because it is due to a parasitic bipolar transistor.

As described above, the conventional FBC memory has a problem that approach for achieving high integration density leads to bipolar disturbance, i.e., reduction of data reliability due to interference between adjacent cell transistors. If adjacent two cell transistors are perfectly isolated from each other, the bipolar disturbance will be solved. However, this ruins the feature of the FBC memory that it may be integrated with a high density. Therefore, it is required to reduce the bipolar disturbance of cell transistors without ruining the feature of the FBC memory, and without reducing the characteristics of logic transistors in peripheral circuitry.

SUMMARY OF THE INVENTION

According to an aspect of the present invention, there is provided a semiconductor device including:

a semiconductor device base having an insulating substrate and a semiconductor layer overlying it;

a cell array formed on the semiconductor device base with cell transistors disposed in such a manner that each of source and drain layers is shared by adjacent two cell transistors arranged in a direction, the cell transistor having an electrically floating channel body to store data defined by a carrier accumulation state of the channel body; and logic transistors formed on the semiconductor device base to constitute a peripheral circuit of said cell array, wherein at least a part of source and drain layers of each the cell transistor is formed with a thickness different from source and drain layers of the logic transistors.

DETAILED DESCRIPTION OF THE EMBODIMENTS

Illustrative embodiments of this invention will be explained with reference to the accompanying drawings below.

Figure 1:
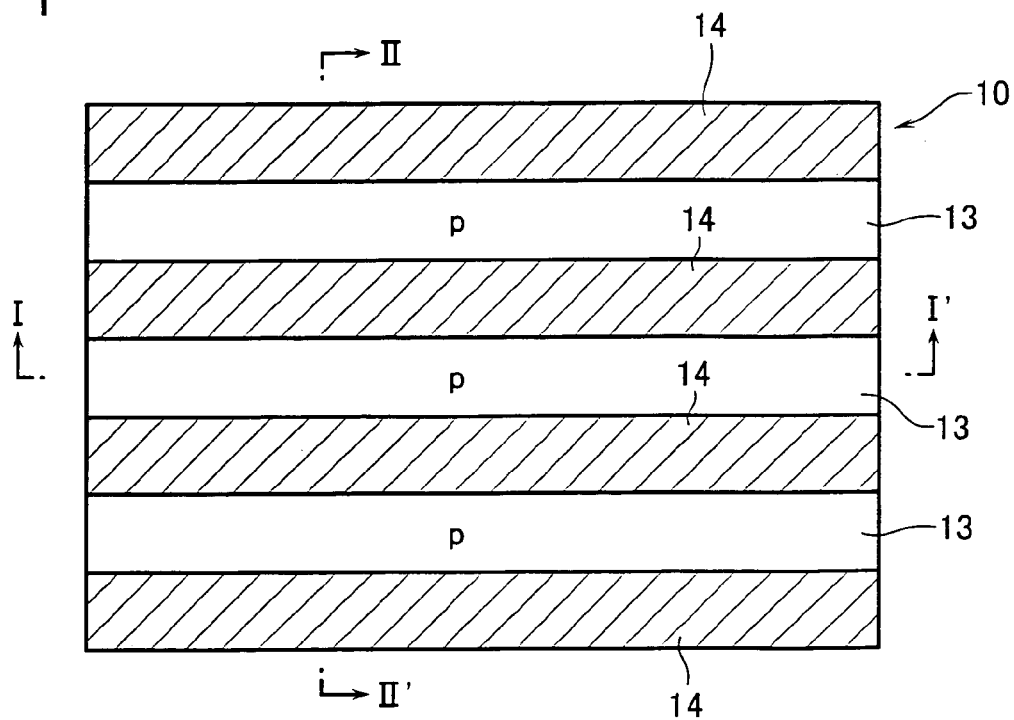
FIG. 1 is a plan view of a cell array area of a semiconductor device base used for an FBC memory in accordance with an embodiment of the present invention.
Figure 2:
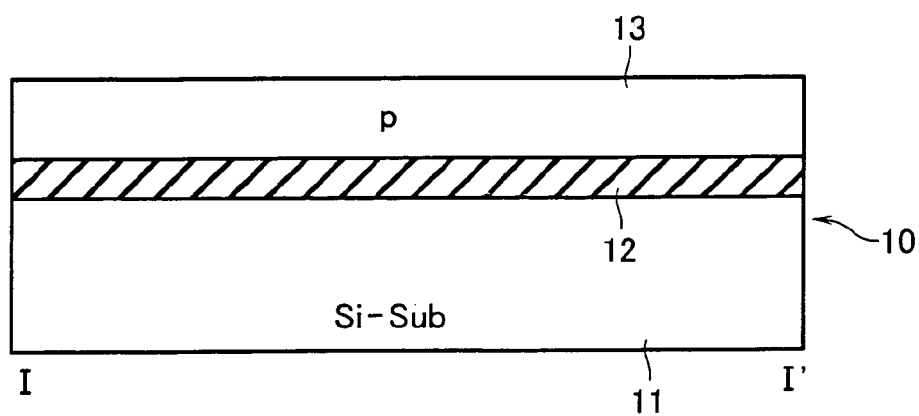
FIG. 2 is a sectional view taken along I-I' line of FIG. 1.
Figure 3:
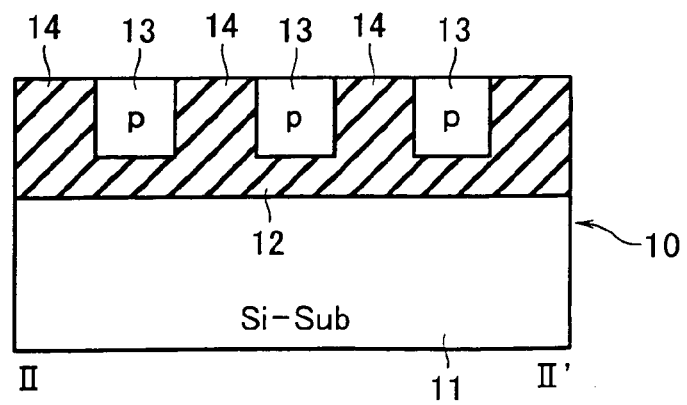
FIG. 3 is a sectional view taken along II-II' line of FIG. 1.

FIGS. 1, 2 and 3 is a plan view of a cell array area in a semiconductor device base 10, which is used for an FBC memory in accordance with an embodiment, and I-I' and II-II' sectional views thereof, respectively. The semiconductor device base 10 is a so-called SOI (Silicon On Insulator) substrate, which has an insulating substrate and a p-type silicon layer 13 overlying it. The insulating substrate is a silicon substrate 11 covered with an insulation film 12 such as silicon oxide.

In the cell array area, the silicon layer 13 is patterned and divided into plural stripe-shaped areas, and device isolation film 14 is buried between the respective areas. That is, the stripe-shaped p-type layers 13 serve as device formation regions, respectively, which are isolated from the substrate 11 by the insulating film 12 and isolated from each other by the device isolating film 14.

Figure 4:
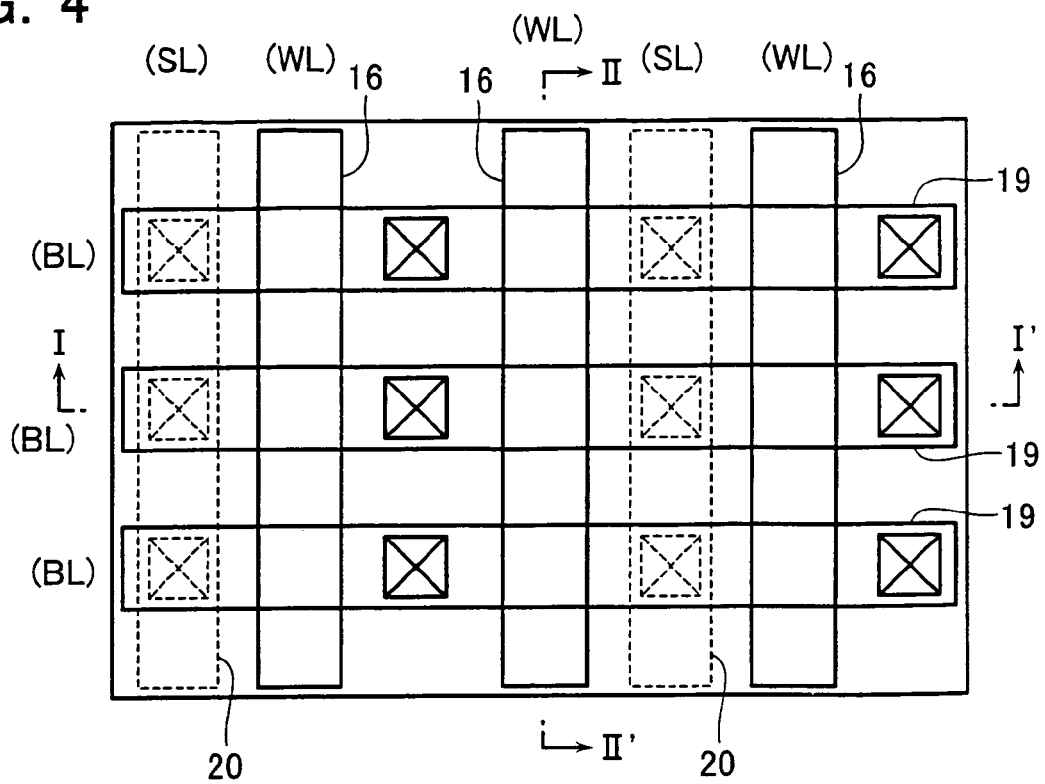
FIG. 4 is a plan view of a memory cell array of the FBC memory.
Figure 5:
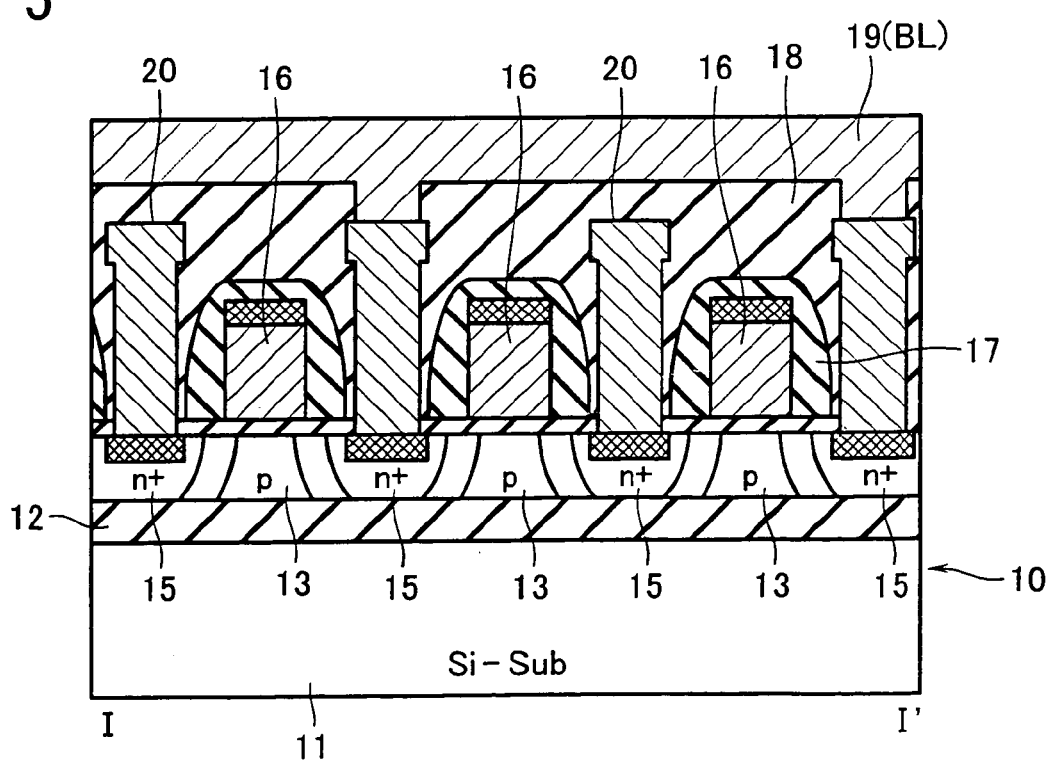
FIG. 5 is a sectional view taken along I-I' line of FIG. 4.
Figure 6:
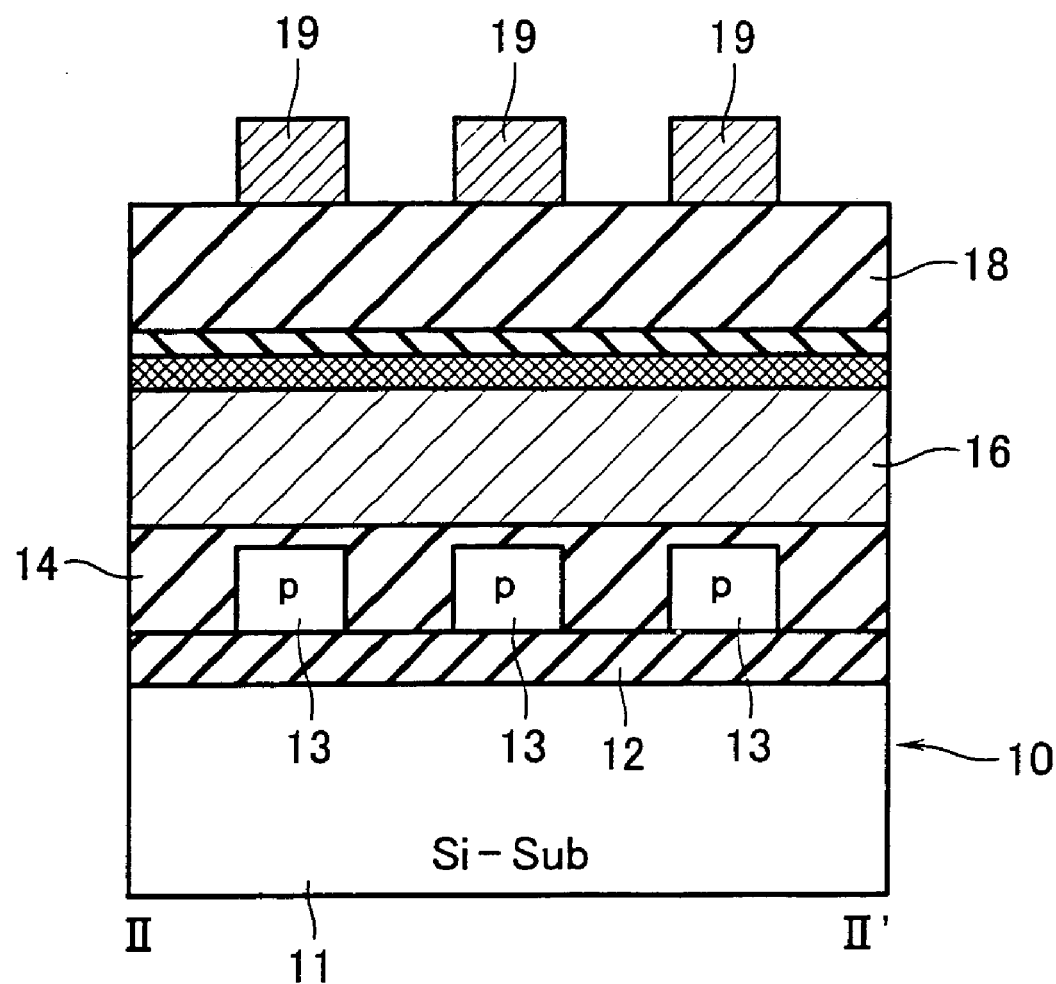
FIG. 6 is a sectional view taken along II-II' line of FIG. 1.

FIGS. 4, 5 and 6 show a layout of a cell array formed on the device base 10, and I-I' and II-II' sectional views thereof, respectively. A gate electrode 16 of a cell transistor is formed as continued crossing the plural stripe-shaped silicon layers 13, and serves as a word line WL. As self-aligned to the gate electrode 16, n-type diffusion layers 15 serving as source and drain layers are formed, so that a cell transistor is formed to have an electrically floating p-type channel body. Adjacent two cell transistors arranged in the direction perpendicular to the word line WL share an n-type diffusion layer (i.e., source/drain layer).

The cell transistors are covered with a silicon nitride film 17, and an interlayer dielectric film 18 is deposited thereon. On the interlayer dielectric film 18, bit lines (BL) 19 are formed. Each bit line 19 is formed continuously as crossing the word lines WL and contacted to one diffusion layers (i.e., common drain layers) 5 of the cell transistors. In the interlayer dielectric film 18, source lines (SL) 20 are buried. Each source line 20 is formed as continued in the direction of the word line WL to couple other diffusion layers (i.e., common source layers) 5 of the cell transistors which are arranged in the direction of the word line WL in common.

So far, the basic cell array arrangement of the FBC memory has been explained. In this embodiment, there is provided a feature in the structural relationship between the cell transistor in the cell array and a logic transistor in peripheral circuitry which are formed on the device base 10. The relationship will be explained in detail bellow.

Figure 7:
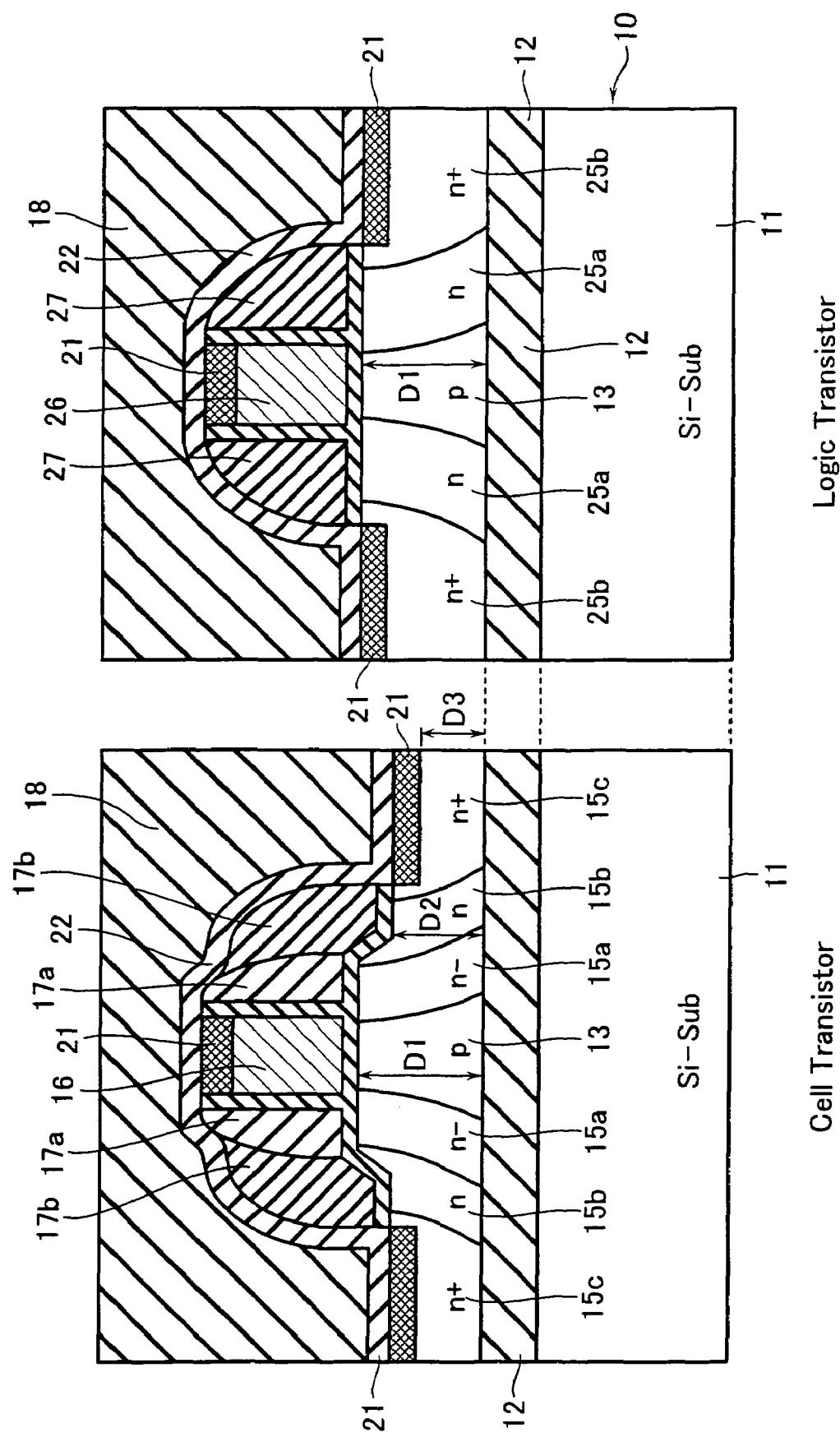
FIG. 7 is a sectional view of a cell transistor portion and a logic transistor portion of the FBC memory.

With giving attention to one cell transistor in the cell array and one logic transistor in the peripheral circuit within an FBC memory in accordance with this embodiment, FIG. 7 shows sectional structures thereof as compared with each other. The device base 10 has, as described above, silicon substrate 11 and p-type silicon layer 13 formed on it with insulating film 12 interposed therebetween. The cell transistor has a gate electrode 16, on either side wall of which first insulating spacers 17a are formed, and further has second insulating spacers 17b formed on the side walls of the first spacers 17a. These double-layered sidewall spacers 17a and 17b are formed of, for example, silicon nitride films.

Source/drain region or layer 15 has n$^-$-type diffusion layers 15a self-aligned to the gate electrode 16, n-type diffusion layer 15b self-aligned to the first insulating spacers 17a and n$^+$-type diffusion layer 15c self-aligned to the second spacers 17b. The entire diffusion layers 15a, 15b and 15c are formed in the silicon layer 13 to reach bottom (i.e., bottom insulating film 12).

In contrast to this, the logic transistor has a gate electrode 26, on either side wall of which single-layered insulating spacers 27 are formed. The sidewall spacers 27 are also formed of, for example, a silicon nitride film. Source/drain layer 25 of the logic transistor has n-type diffusion layers 25a self-aligned to the gate electrode 26 and n$^+$-type diffusion layers 25b self-aligned to the spacers 27. For example, the n-type diffusion layers 25a are formed in the silicon layer 13 to reach bottom simultaneously with the n-type diffusion layers 15b of the cell transistor with the same impurity concentration as the layers 15b. The n$^+$-type diffusion layers 25b are formed in the silicon layer 13 to reach bottom simultaneously with the n$^+$-type diffusion layer 15c of the cell transistor with the same impurity concentration as the n$^+$-type layers 15c in this embodiment.

A significant structural difference between the cell transistor and the logic transistor is in a fact that source/drain layers 15 and 25 are formed with thicknesses different from each other. This point will be explained in detail. In both areas of cell transistor and logic transistor, the silicon layer 13 has an initial thickness of D1, and channel regions thereof are formed on these portions with the same thickness D1. In the cell transistor area, the silicon layer 13 is reduced in thickness just under the boundaries between the first and second insulating spacers 17a and 17b. That is, the silicon layer portions, in which n-type layers 15b and n$^+$-type layers 15c are to be formed, are made thinner than the remaining portion to have a thickness of D2(<D1). By contrast, in the logic transistor area, the p-type silicon layer 13 is kept with the same thickness D1 from channel region to source and drain regions as that of the channel region of the cell transistor.

On the gate electrode 16, and source/drain region 15, self-aligned metal silicide (i.e., salicide) films 21 are formed. Salicide films 21 are also formed on the gate electrode 26 and source/drain region 25 of the logic transistor. These transistors are covered with a barrier film 22 such as silicon nitride, and the interlayer dielectric film 18 is formed on the barrier film 22.

In this embodiment as described above, at least a part of cell transistor's source/drain layer is thinned within the p-type silicon layer 13 on which cell transistors and logic transistors are formed. As a result, the lateral resistance of the cell transistor's source/drain layer becomes large, thereby suppressing the bipolar disturbance. In addition, the source/drain layer becomes a defective crystal layer (i.e., crystalline state where carrier life time thereof has been shortened) because silicide is formed on the top portion. This also is effective for suppressing the bipolar disturbance.

In contrast to this, there is not increased in source/drain resistance in the logic transistor in peripheral circuitry, so that it is assured of high-rate performance of the logic transistor. Therefore, with this embodiment, high-speed performance of the logic transistor and data reliability of the cell transistor may be satisfied simultaneously.

Next, a fabrication process of the FBC memory in accordance with this embodiment will be explained referring to FIGS. 8 to 12, which show sectional views in the respective steps, corresponding to FIG. 7.

Figure 8:
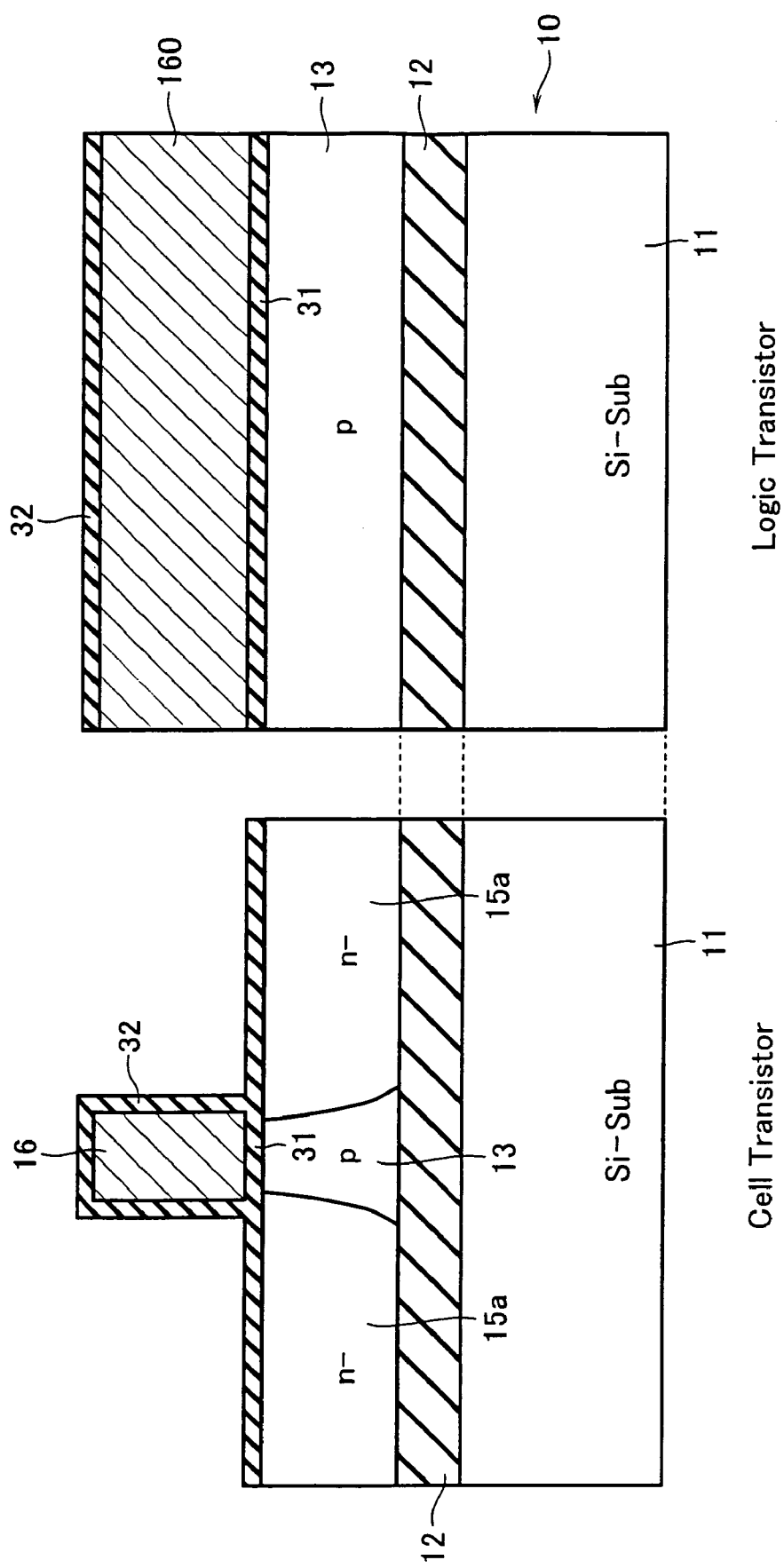
FIG. 8 is a sectional view for explaining the gate electrode formation step of the cell transistor.

As shown in FIG. 8, after having formed gate insulating film 31 on the p-type silicon layer 13 of the device base 10, a gate conductive film, for example polycrystalline silicon (polysilicon) film 160, is deposited thereon. This polysilicon film 160 is etched by RIE (Reactive Ion Etching), whereby gate electrode 16 serving as a word line is formed in the cell array area. During this RIE step, the peripheral circuit area is covered with a mask (not shown) so that the polysilicon film 160 is remained as it is on the area without being patterned.

Following the formation of the gate electrode 16, thermal oxidation is performed to form thin oxide film 32 on the gate electrode 16 and p-type silicon layer 13, and then ion implantation is performed using the gate electrode 16 as a mask. As a result, n$^-$-type layers 15a of source/drain region are formed in the p-type layer 13 in the cell array area with such a depth as reaching the bottom insulating film 12.

Figure 9:
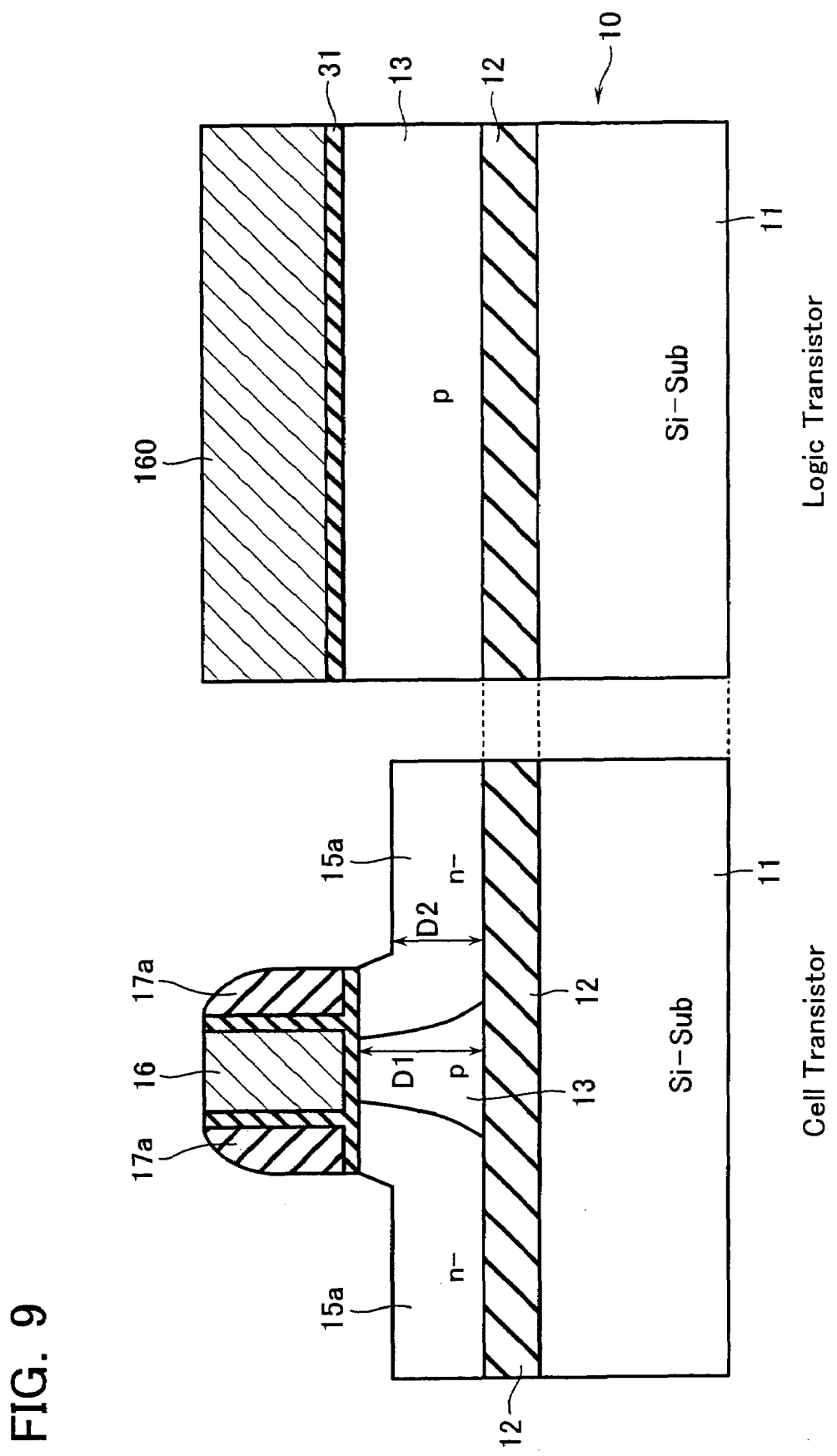
FIG. 9 is a sectional view for explaining the steps of forming first insulating spacers and n$^-$-type diffusion layers of the cell transistor.

Next, a silicon nitride film is deposited by, for example, CVD (Chemical Vapor Deposition), and then it is etched by RIE, thereby resulting in that first insulating spacers 17a are formed, as shown in FIG. 9, on either side wall of the gate electrode 16. At this RIE step, over-etching is performed to recess the exposed top portion of the silicon layer 13. With this recess etching, as shown in FIG. 9, the thickness of the source/drain region is reduced to D2 from D1. At this time, the gate electrode 16 will also be reduced in thickness. However, pre-determine the gate electrode thickness considering the above-described thickness reduction, and there is no problem. The thickness reduction of the polysilicon film 160 in the peripheral circuit area may be utilized as similar to it.

Figure 10:
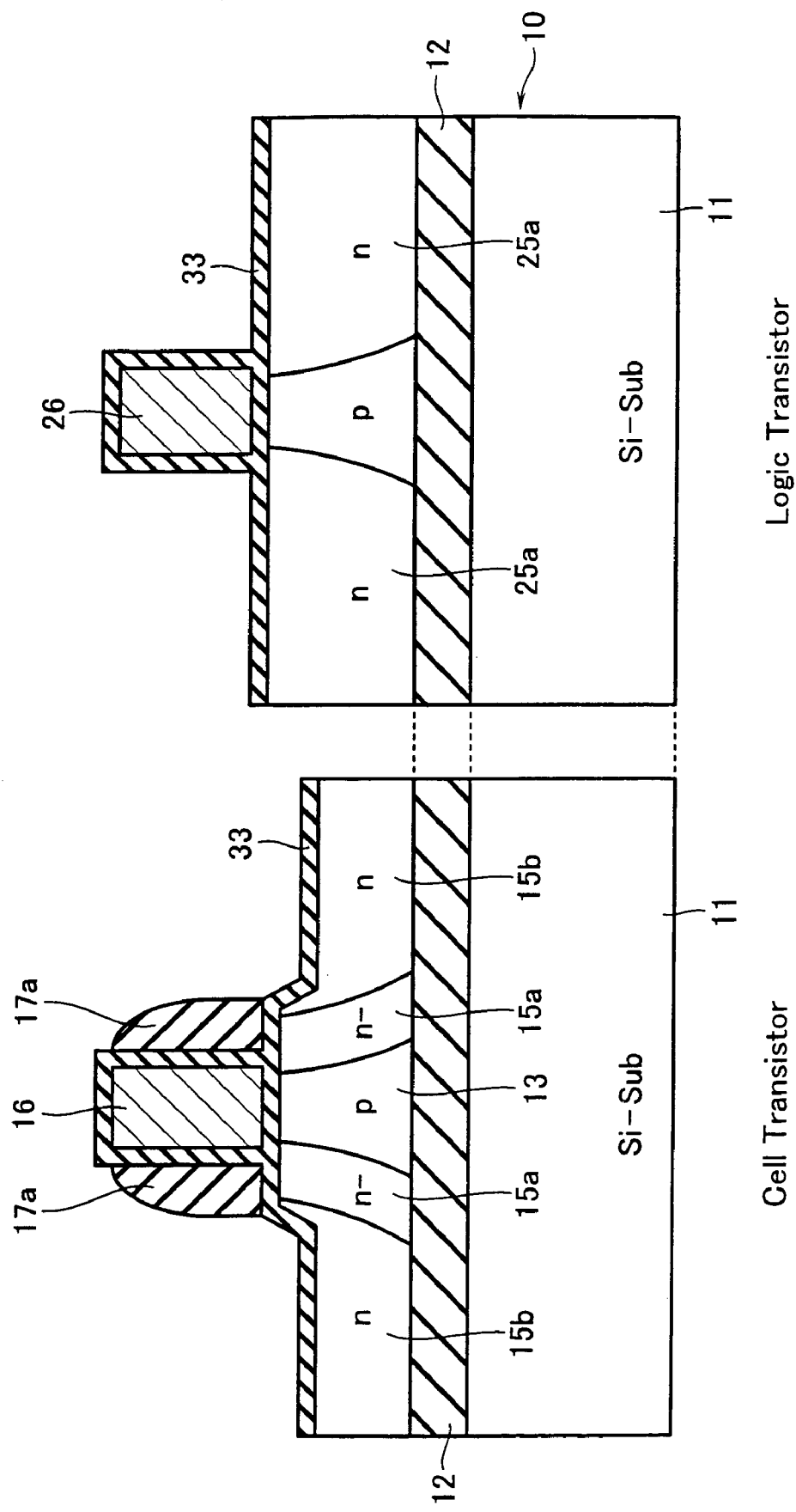
FIG. 10 is a sectional view for explaining the steps of forming the gate electrode of the logic transistor and n-type diffusion layers of both transistors.

Thereafter, as shown in FIG. 10, the polysilicon film 160 in the peripheral circuit area is patterned by RIE to gate electrode 26 of the logic transistor. After having formed a thin oxide 33 by post-oxidation, ion implantation is performed using the gate electrodes 16, 26 and insulating spacers 17a as a mask. As a result, n-type diffusion layers 15b and 25a are formed simultaneously in the source/drain regions of the cell transistor and the logic transistor, respectively. The n-type layers 15b and 25a are self-aligned to the spacers 17a and gate electrode 26, respectively. These diffusion layers 15b and 25a are also formed to reach bottom in the p-type layer 13.

Figure 11:
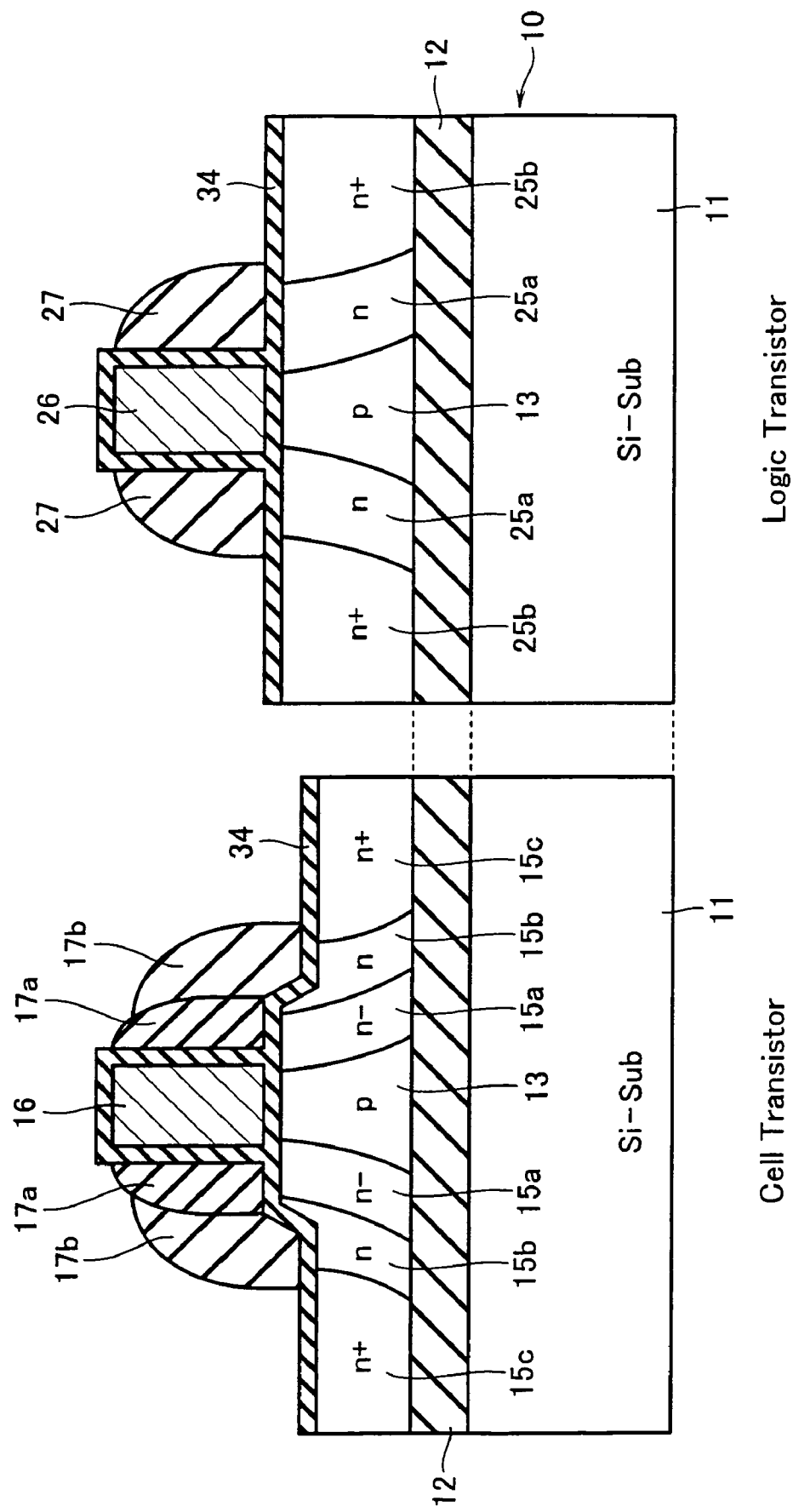
FIG. 11 is a sectional view for explaining the steps of forming the second insulating spacers of the cell transistor, the insulating spacers of the logic transistor and n$^+$-type diffusion layers of both transistors.

Following it, a silicon nitride film is deposited by CVD, and then etched by RIE. As a result, as shown in FIG. 11, second insulating spacers 17b are formed on either side wall of the gate electrode 16 with the first spacers 17a of the cell transistor, and simultaneously with it insulating spacers 27 are formed on either side wall of the gate electrode 26 of the logic transistor. At this RIE step for etching silicon nitride, the etching rate ratio of silicon nitride to silicon oxide or silicon will be preferably selected as greater than that at the RIE step explained with FIG. 9. With this consideration, undesirable recess etching of the silicon may be suppressed.

After having formed a thin oxide film 34 by post-oxidation, ion implantation is performed using the gate electrodes 16, 26 with the insulating spacers 17a, 17b and 27 as masks. As a result, as shown in FIG. 11, n$^+$-type diffusion layers 15c and 25b are formed simultaneously in the source/drain regions of the cell transistor and the logic transistor, respectively. These n$^+$-type layers 15c and 25b are self-aligned to the spacers 17b and 27, respectively, and formed to reach bottom in the p-type layer 13.

Figure 12:
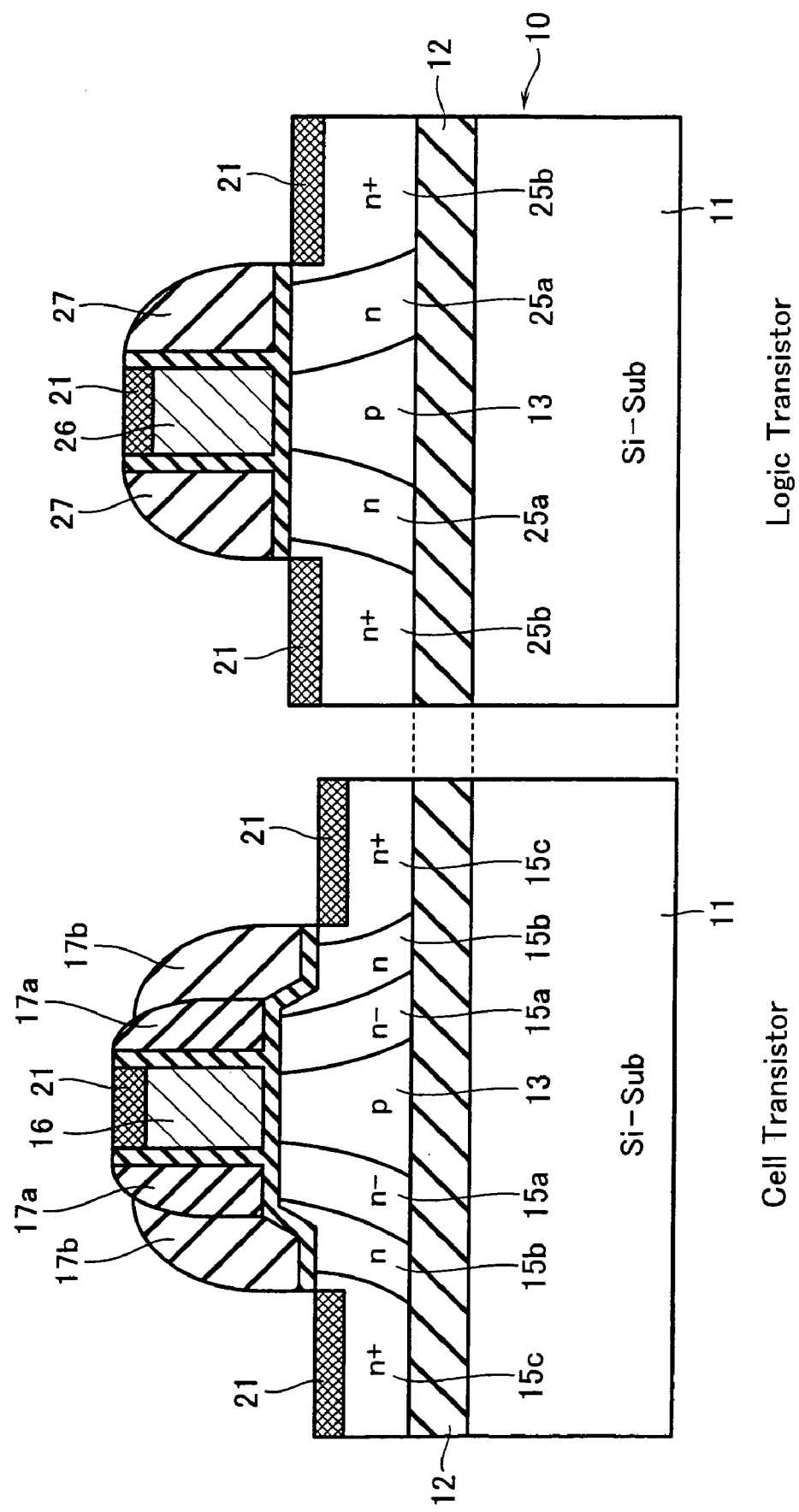
FIG. 12 is a sectional view for explaining the salicide step of the cell transistor and logic transistor.

After oxide film removing process for the surface of the gate electrodes and source/drain regions, a refractory metal film such as Ni or Co is deposited, and the wafer is subjected to thermal anneal. As a result, as shown in FIG. 12, metal silicide films 21 are formed on respective gate electrodes and source/drain regions.

Following it, the barrier film 22 and interlayer insulating film 18 are sequentially deposited so that the structure shown in FIG. 7 is obtained. As described in FIGS. 4 to 6, in the cell array area, bit lines BL are formed on the interlayer insulating film 18, and source lines SL are buried in the interlayer insulating film 18. In the peripheral circuit area, wirings are formed on/in the interlayer insulating film 18 as well as in the cell array area.

In this embodiment, it is required of the cell transistor to have optimum thicknesses D1 and D2 of the channel region portion and source/drain region portion, respectively. To assure of a sufficient data margin between "0" and "1" data which are defined by carrier accumulation states of the channel body, it is not allowed to extremely lessen the thickness D1 of the p-type silicon layer 13. For example, D1 is set to be about 20 [nm] to 200 [nm]. In this case, in order to effectively suppress the bipolar disturbance of the cell transistor, source/drain thickness D2 is set to be about 10 [nm] to 100 [nm]. The lower limit of the thickness D2 is necessary for preferably assuring of silicon layer presence of about D3=5 [nm] to 50 [nm] in the source/drain region after having formed silicide film 21 thereon. If the remaining silicon thickness D3 becomes smaller than the above-described value, the source/drain resistance will be increased, and it leads to deterioration of a desirable read/write performance.

Figure 13:
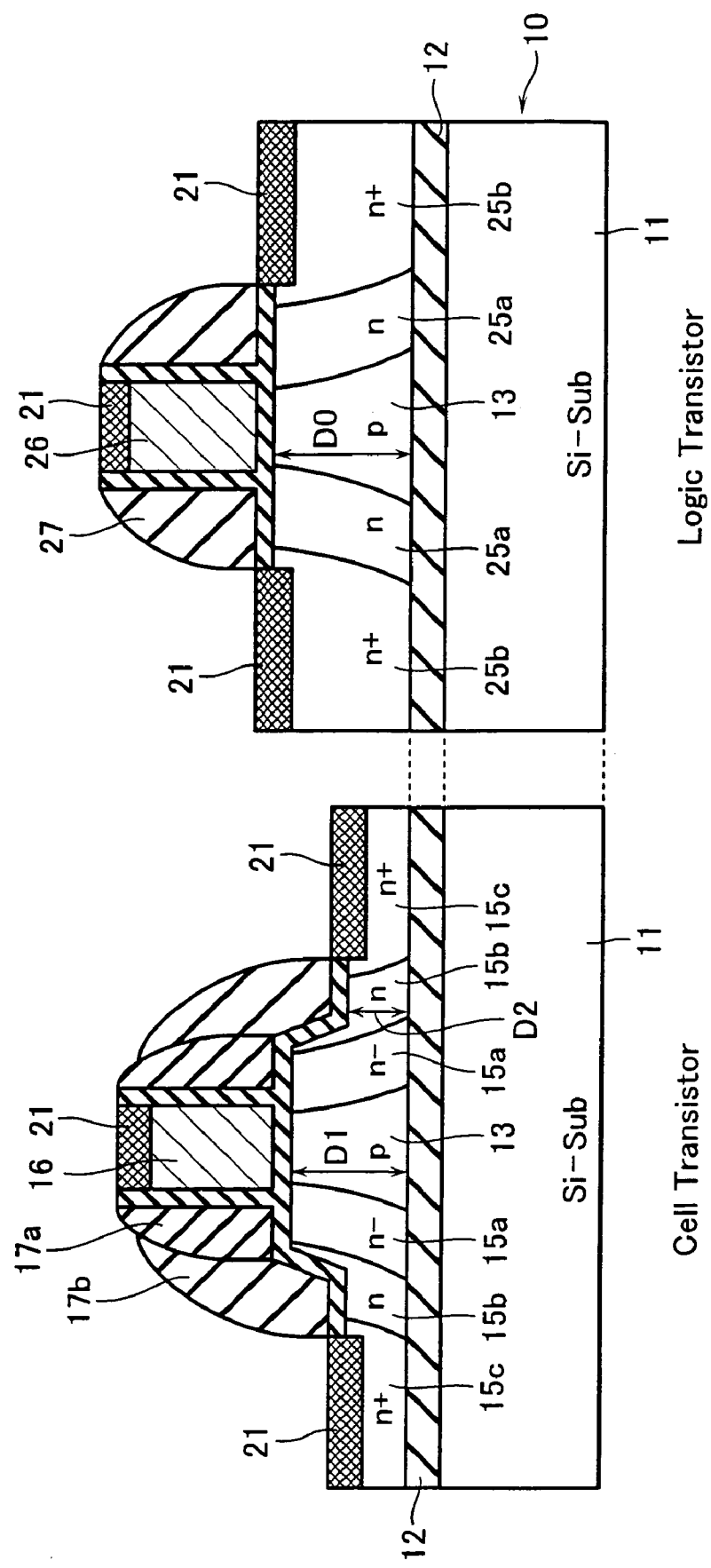
FIG. 13 is a sectional view of a cell transistor portion and a logic transistor portion of an FBC memory in accordance with another embodiment.

Although, in the above-described embodiment, p-type silicon layer thickness in the cell array area is identical with that in the peripheral circuit area, it is allowed to make those different from each other. For example, FIG. 13 shows a device structure including one cell transistor and one logic transistor in accordance with another embodiment in comparison with the above-described embodiment shown in FIG. 7.

In this embodiment, p-type silicon layer 13 has an in initial thickness D0. The cell array area is initially subjected to silicon etching with a mask covering the peripheral circuit area, thereby becoming to have a thickness D1(<D0). This silicon etching is performed, for example, before the burying step of the device insulating film 14 shown in FIGS. 1 to 3. Alternatively, it may be performed after having buried the device insulating film 14. Thereafter, by use of the same processes as in the above-described embodiment, it is provided a cell transistor with source/drain region thinned to D2(<D1).

Figure 14:
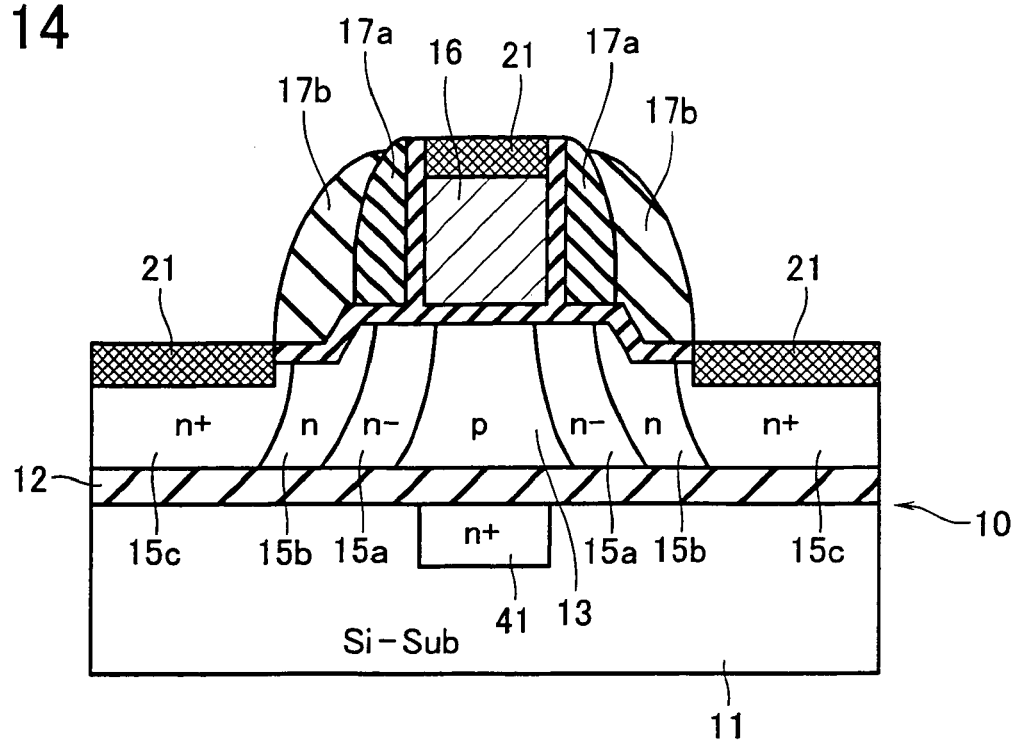
FIG. 14 is a sectional view of a cell transistor of an FBC memory in accordance with another embodiment.

FIG. 14 shows a cell transistor structure of an FBC memory in accordance with another embodiment. A difference between this cell transistor and that shown in FIG. 7 is in that this cell transistor has an auxiliary gate electrode 41, which is buried in the substrate 11. Supposing that the silicon substrate 11 is p-type, the auxiliary gate electrode 41 is formed of an $n^+$-type layer underlying the insulating film 12 just under the channel body of the cell transistor. This auxiliary gate electrode 41 serves as an auxiliary word line elongated in parallel with the gate electrode 16 for assisting the word line to control the channel body potential.

Figure 15:
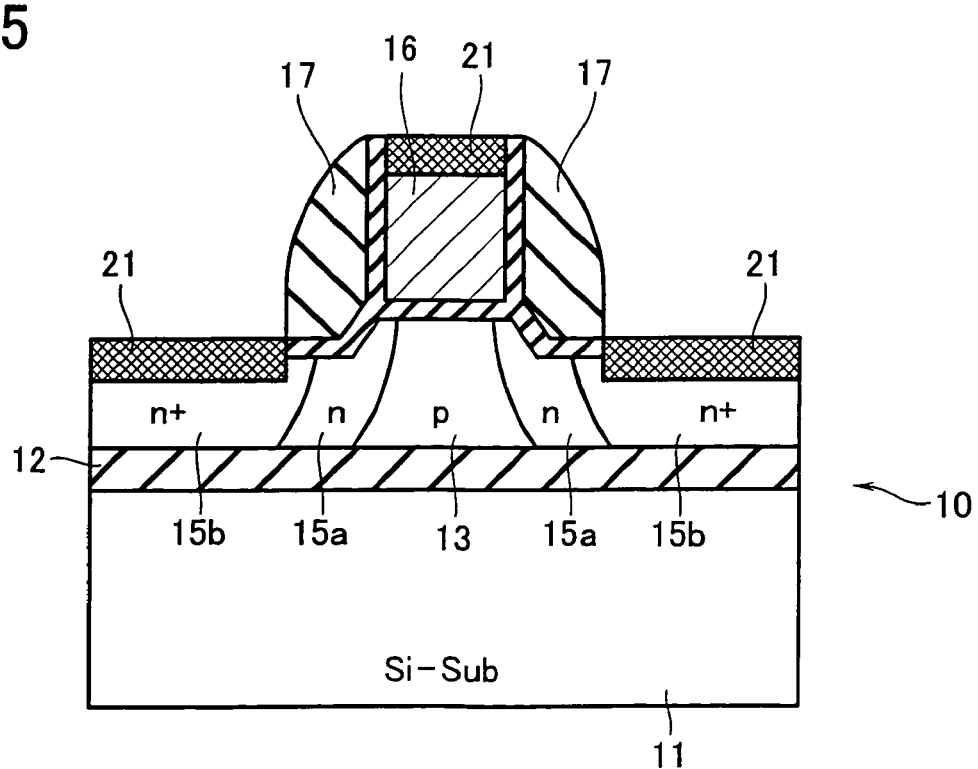
FIG. 15 is a sectional view of a cell transistor of an FBC memory in accordance with another embodiment.
Figure 16:
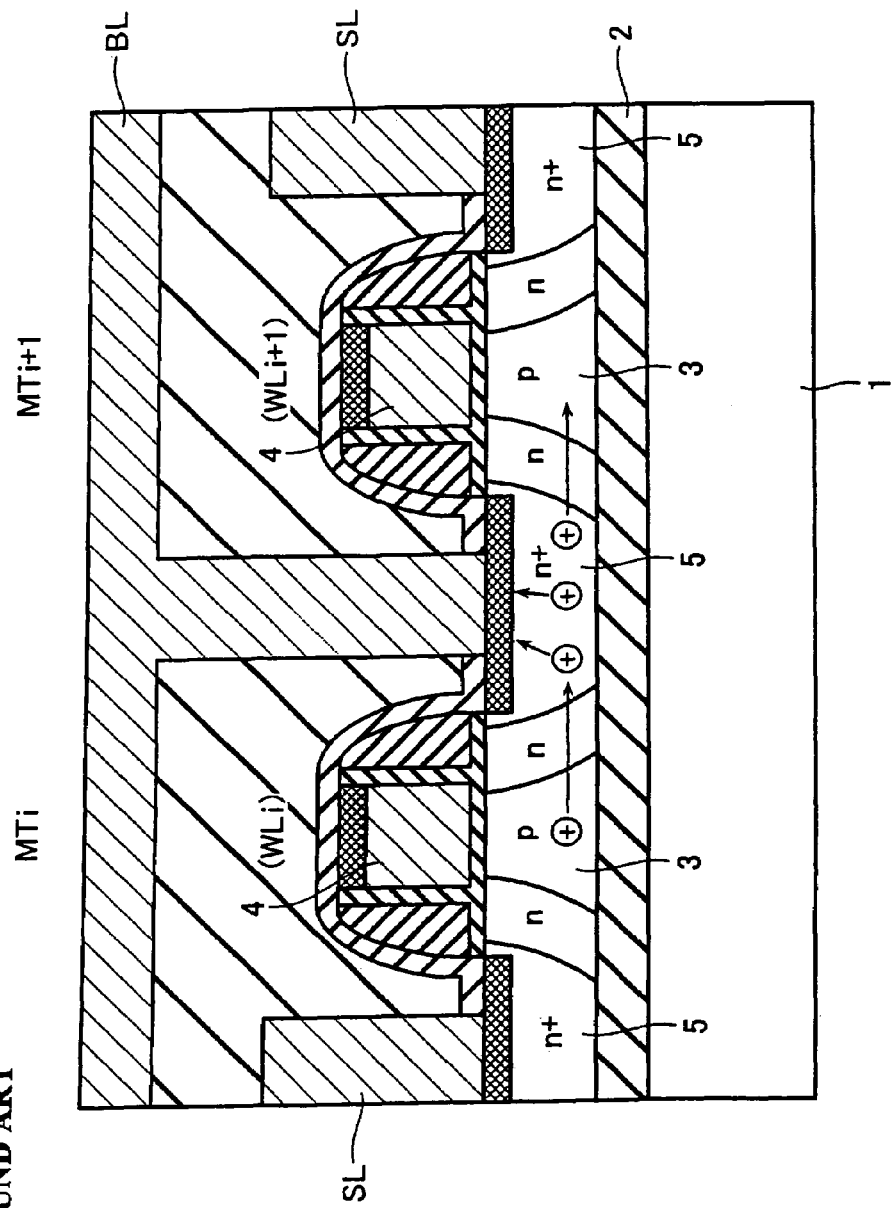
FIG. 16 is a diagram for explaining bipolar disturbance in a conventional FBC memory.

FIG. 15 shows a cell transistor structure of an FBC memory in accordance with still another embodiment. As different from the cell transistor shown in FIG. 7, source/drain region 15 is recessed just outside the channel region. In detail, after having formed the gate electrode 16 and prior to the formation of the insulating spacers 17, the p-type silicon layer 13 is recessed, thereby resulting that the source/drain regions 15 are thinned.

Further, the insulating spacers 17 are not doubled unlike those shown in FIG. 7. Each source/drain region is formed of n-type diffusion layer 15a self-aligned to the gate electrode 16 and $n^+$-type diffusion layer 15b self-aligned to the spacer 17. This is also different from the cell transistor shown in FIG. 7.

So far, embodiments with n-channel cell transistors have been explained. This invention is not limited to the above-described embodiments. For example, this invention may be applied to a case where p-type cell transistors are used. The peripheral circuitry may also be formed of p-type transistors or CMOS circuits with both p-channel transistors and n-type transistors.

Although, in the above-described embodiment, the source/drain diffusion layers of the cell transistor and logic transistor are formed simultaneously, these may be formed independently of each other with desirable impurities and concentrations thereof, respectively. Further, this invention is effective in such a case that the cell transistor has only one source/drain diffusion layer. Further, it will be understood by those skilled in the art that various changes in form and detail may be made without departing from the spirit, scope, and teaching of the invention.

What is claimed is:

1. A semiconductor memory device, comprising:
a semiconductor device base having an insulating substrate and a semiconductor layer overlying it;
a cell array formed on said semiconductor device base with cell transistors disposed in such a manner that each of source and drain layers is shared by adjacent two cell transistors arranged in a direction, said cell transistors each having an electrically floating channel body to store data defined by a carrier accumulation state of the channel body;
logic transistors formed on said semiconductor device base to constitute a peripheral circuit of said cell array,
at least a part of source and drain layers of each said cell transistor is formed with a thickness different from source and drain layers of said logic transistors; and
wherein each of said cell transistors comprises:
a first gate electrode formed above the semiconductor layer with a gate insulating film interposed therebetween;
first and second insulating spacers formed on either side wall of the first gate electrode; and
source and drain layers each comprising first diffusion layers formed in the semiconductor layer to reach the insulating substrate and self-aligned to the gate electrode, second diffusion layers formed in the semiconductor layer to reach the insulating substrate and self-aligned to the first insulating spacers and third diffusion layers formed in the semiconductor layer to reach the insulating substrate and self-aligned to the second insulating spacers, and
a portion of the semiconductor layer in which the second and third diffusion layers are formed is thinned in comparison with the remaining portions.

2. A semiconductor memory device, comprising:
a semiconductor device base having an insulating substrate and a semiconductor layer overlying it, in a cell array area of which a plurality of stripe-shaped device formation regions are defined;
a cell array formed on said semiconductor device base with cell transistors disposed in such a manner that each of source and drain layers is shared by adjacent two cell transistors arranged in an elongated direction of the device formation regions, said cell transistors each having an electrically floating channel body to store data defined by a carrier accumulation state of the channel body;
logic transistors formed on said semiconductor device base to constitute a peripheral circuit of said cell array,
at least a part of source and drain layers of each said cell transistor is formed with a thickness different from source and drain layers of said logic transistors, and
wherein each of said cell transistors comprises:
a first gate electrode formed above the semiconductor layer with a gate insulating film interposed therebetween;
first and second insulating spacers formed on either side wall of the first gate electrode; and
source and drain layers each comprising first diffusion layers formed in the semiconductor layer to reach the insulating substrate and self-aligned to the gate electrode, second diffusion layers formed in the semiconductor layer to reach the insulating substrate and self-aligned to the first insulating spacers and third diffusion layers formed in the semiconductor layer to reach the insulating substrate and self-aligned to the second insulating spacers, and wherein
a portion of the semiconductor layer in which the second and third diffusion layers are formed is thinned in comparison with the remaining portions.

3. The semiconductor memory device according to claim 2, wherein the first gate electrode is formed as crossing the plurality of the device formation regions to be continued as a word line, which plural cell transistors share.

4. The semiconductor memory device according to claim 3, further comprising:
an interlayer dielectric film formed to cover said cell transistors; and
bit lines each formed on the interlayer dielectric film as crossing the word line to be contacted to a drain diffusion layer which adjacent two cell transistors share, the two cell transistors being arranged in the direction perpendicular to the word line.

5. The semiconductor memory device according to claim 4, further comprising
source lines each buried in the interlayer dielectric film to be contacted to a source diffusion layer which adjacent two cell transistors share, the two cell transistors being arranged in the direction perpendicular to the word line.

* * * * *